(12) United States Patent
Hara

(10) Patent No.: US 10,603,921 B2
(45) Date of Patent: Mar. 31, 2020

(54) LIQUID CIRCULATION DEVICE AND LIQUID DISCHARGE DEVICE

(71) Applicant: TOSHIBA TEC KABUSHIKI KAISHA, Shinagawa-ku, Tokyo (JP)

(72) Inventor: Kazuhiro Hara, Numazu Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/242,039

(22) Filed: Jan. 8, 2019

(65) Prior Publication Data

US 2019/0248150 A1 Aug. 15, 2019

(30) Foreign Application Priority Data

Feb. 15, 2018 (JP) .................................. 2018-024793

(51) Int. Cl.
| | |
|---|---|
| *B41J 2/18* | (2006.01) |
| *B41J 2/045* | (2006.01) |
| *B41J 2/175* | (2006.01) |
| *H01L 41/04* | (2006.01) |

(52) U.S. Cl.
CPC ............. *B41J 2/18* (2013.01); *B41J 2/04548* (2013.01); *B41J 2/04581* (2013.01); *B41J 2/17596* (2013.01); *H01L 41/042* (2013.01); *B41J 2202/12* (2013.01)

(58) Field of Classification Search
CPC ...... B41J 2/18; B41J 2/04548; B41J 2/04581; B41J 2/17596; B41J 2202/12; H01L 41/042

See application file for complete search history.

(56) References Cited

U.S. PATENT DOCUMENTS

| | | | |
|---|---|---|---|
| 9,914,308 B2 | 3/2018 | Yamada et al. | |
| 2005/0237033 A1* | 10/2005 | Shirakawa | B60K 6/26 322/28 |
| 2013/0214825 A1* | 8/2013 | Wasekura | H02M 1/08 327/109 |
| 2017/0126148 A1 | 5/2017 | Okaguchi | |
| 2018/0072069 A1 | 3/2018 | Hara et al. | |

\* cited by examiner

*Primary Examiner* — Anh T Vo

(74) *Attorney, Agent, or Firm* — Amin, Turocy & Watson, LLP

(57) ABSTRACT

In accordance with an embodiment, a liquid circulation device comprises a plurality of piezoelectric pumps configured to circulate liquid in a replenishing tank to a liquid discharge head through an operation of a piezoelectric actuator thereof; a DC power supply; a switching circuit configured to switch an output of the DC power supply to supply a driving voltage to the piezoelectric actuator of the piezoelectric pump; and a control circuit configured to control the driving voltage by controlling a switching timing of the switching circuit.

20 Claims, 10 Drawing Sheets

LIQUID CIRCULATION DEVICE AND LIQUID DISCHARGE DEVICE

CROSS-REFERENCE TO RELATED APPLICATION

This application is based upon and claims the benefit of priority from Japanese Patent Application No. P2018-024793, filed on Feb. 15, 2018 the entire contents of which are incorporated herein by reference.

FIELD

Embodiments described herein relate generally to a liquid circulation device, a liquid discharge device, and methods related thereto.

BACKGROUND

A liquid discharge device includes a liquid discharge head (inkjet head) for discharging liquid (ink) and a liquid circulation device for circulating liquid in a circulation path including the liquid discharge head. The liquid circulation device replenishes ink from an ink replenishing tank to the liquid discharge head and collects the ink from the liquid discharge head to return it to the ink replenishing tank. The liquid circulation device has a pump that uses an actuator becoming deformed according to an applied voltage. The liquid circulation device adjusts a driving voltage to be applied to the actuator constituting the pump by adjusting an output voltage of a booster circuit. Thus, the liquid circulation device adjusts a liquid feed capability of the pump.

However, when the driving voltage applied to the actuator is adjusted by adjusting the output voltage of the booster circuit in this way, it is necessary to provide as many booster circuits as the number of the pumps. As a result, there is a problem that an installation space of the circuit increases.

DETAILED DESCRIPTION

In accordance with an embodiment, a liquid circulation device comprises a plurality of piezoelectric pumps configured to circulate liquid in a replenishing tank to a liquid discharge head through an operation of a piezoelectric actuator thereof; a DC power supply; a switching circuit configured to switch an output of the DC power supply to supply a driving voltage to the piezoelectric actuator of the piezoelectric pump; and a control circuit configured to control the driving voltage by controlling a switching timing of the switching circuit.

Hereinafter, a liquid circulation device and a liquid discharge device according to an embodiment are described with reference to the accompanying drawings.

Figure 1:
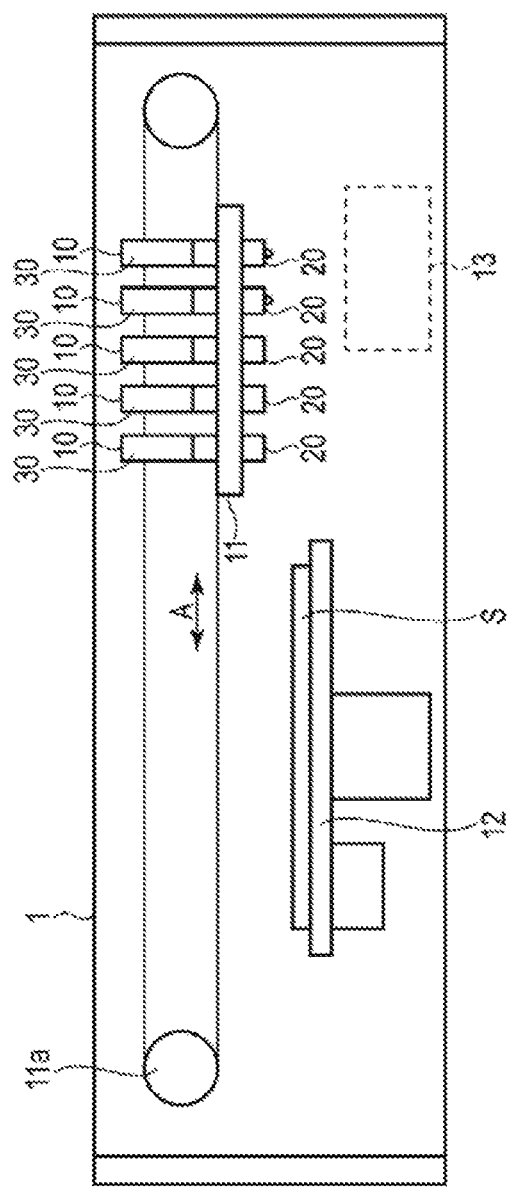
FIG. 1 is a diagram illustrating an example of a configuration of an inkjet recording apparatus according to an embodiment.
Figure 2:
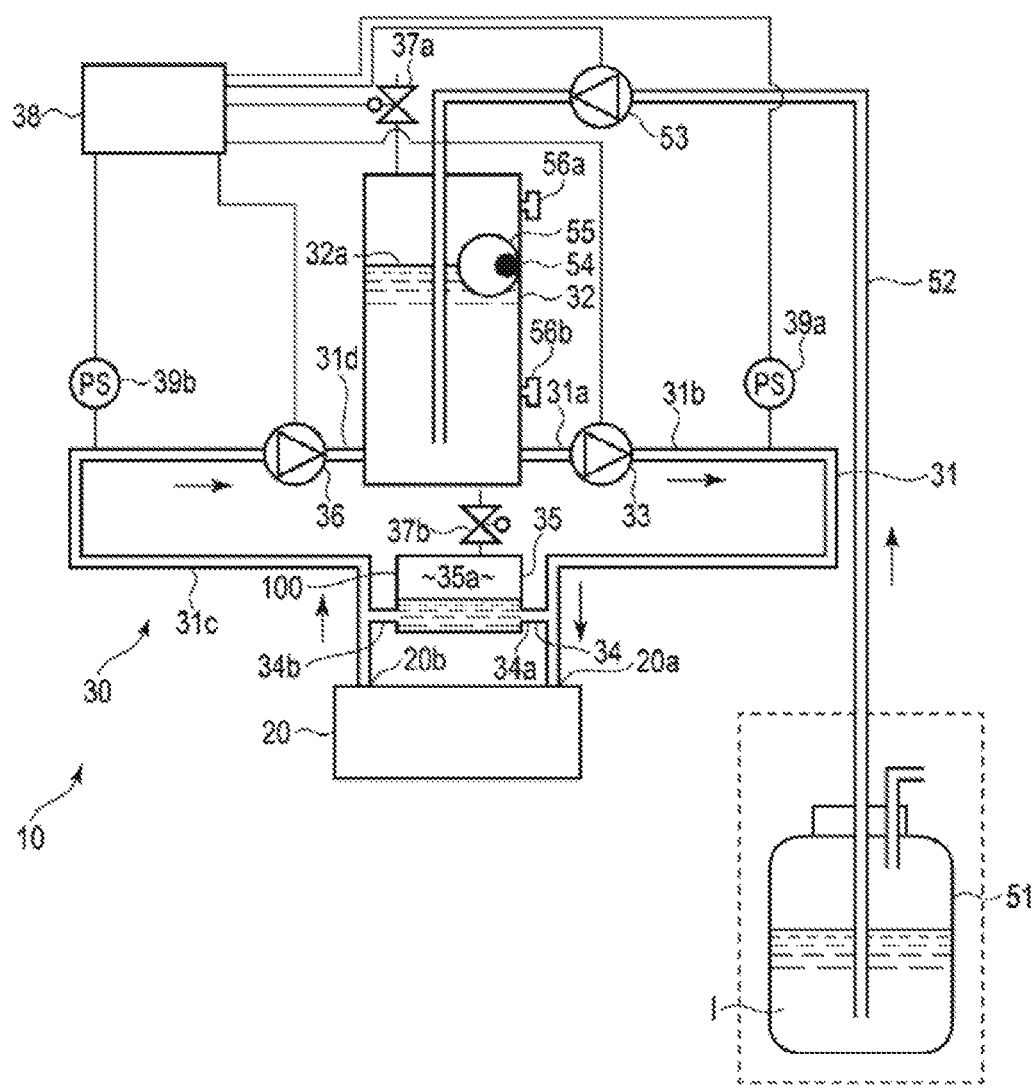
FIG. 2 is a diagram illustrating an example of a configuration of a liquid discharge device according to the embodiment.
Figure 3:
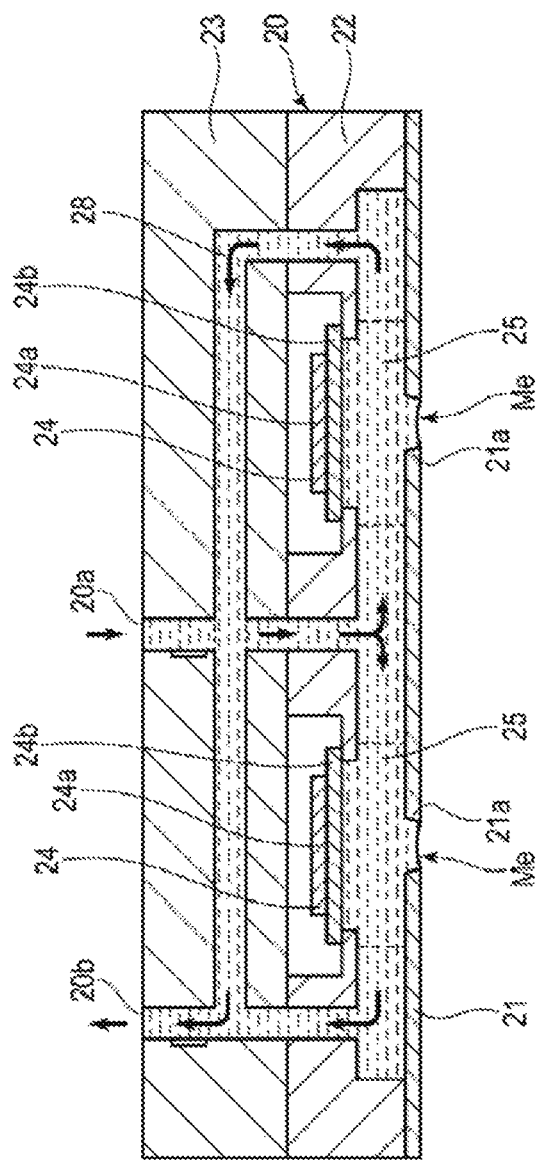
FIG. 3 is a diagram illustrating an example of a configuration of a liquid discharge head according to the embodiment.
Figure 4:
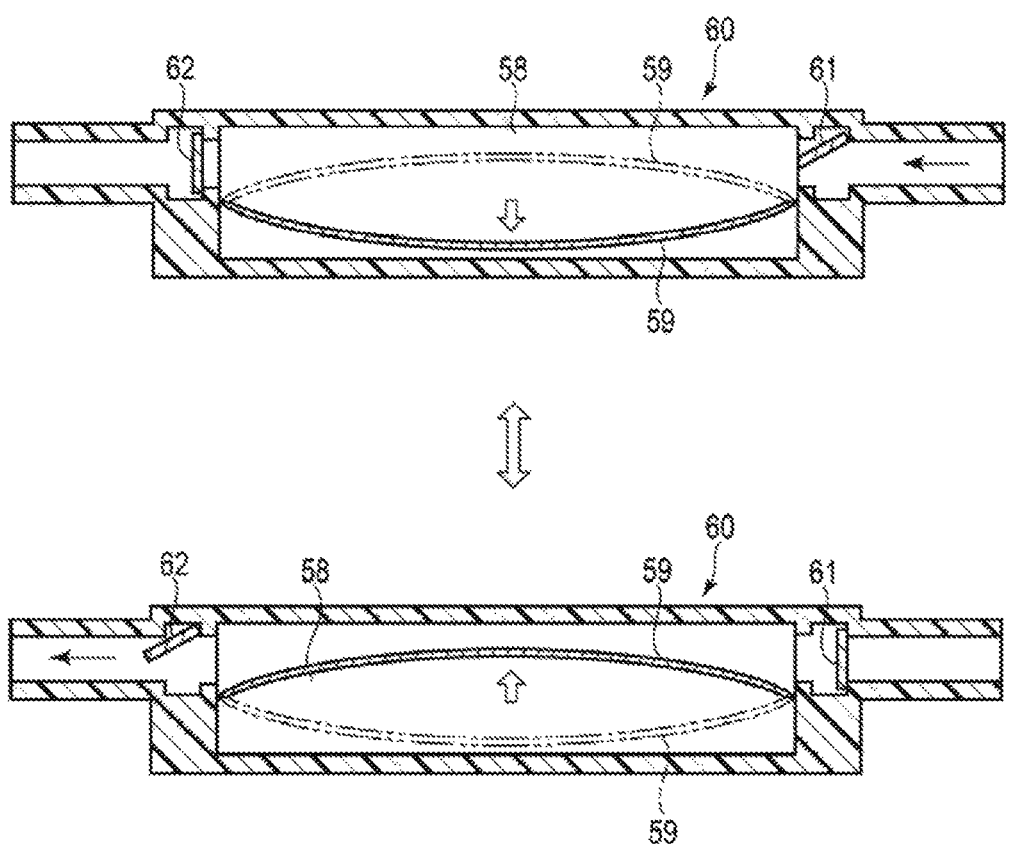
FIG. 4 is a diagram illustrating an example of a configuration of a piezoelectric pump according to the embodiment.

Below, a liquid discharge device 10 and an inkjet recording apparatus 1 including the liquid discharge device 10 according to an embodiment are described with reference to FIG. 1 to FIG. 11. For convenience of description, the configuration is appropriately enlarged, reduced or omitted in each drawing. FIG. 1 is a side view illustrating a configuration of the inkjet recording apparatus 1. FIG. 2 is a diagram illustrating a configuration of the liquid discharge device 10. FIG. 3 is a diagram illustrating a configuration of a liquid discharge head 20. FIG. 4 is a diagram illustrating configurations of a first circulation pump 33 and a second circulation pump 36.

The inkjet recording apparatus 1 shown in FIG. 1 includes a plurality of the liquid discharge devices 10, a head support mechanism 11 for movably supporting the liquid discharge device 10, a medium support mechanism 12 for movably supporting an image receiving medium S and a host control device 13.

As shown in FIG. 1, the plurality of the liquid discharge devices 10 is arranged in parallel in a predetermined direction and is supported by the head support mechanism 11. The liquid discharge device 10 includes the liquid discharge head 20 and a circulation device 30, which are integrated with each other. The liquid discharge device 10 forms a desired image on the image receiving medium S facing the liquid discharge head 10 by discharging, for example, ink I as the liquid from the liquid discharge head 20.

The plurality of the liquid discharge devices 10 discharges ink in a plurality of colors, for example, cyan ink, magenta ink, yellow ink, black ink, and white ink, respectively, but the colors or characteristics of the ink I to be used are not limited. For example, in place of the white ink, transparent glossy ink, special ink that develops color when irradiated with infrared rays or ultraviolet rays, or the like may be discharged. The plurality of the liquid discharge devices 10 has the same configuration although the ink used therein is different.

First, the liquid discharge head 20 is described.

The liquid discharge head 20 shown in FIG. 3 is an inkjet head, and includes a supply port 20a into which the ink flows, a collection port 20b through which the ink flows out, a nozzle plate 21 having a plurality of nozzle holes 21a, a substrate 22, and a manifold 23 bonded to the substrate 22.

The substrate 22 is bonded to face the nozzle plate 21, and is formed into a predetermined shape to form a predetermined ink flow path 28 including a plurality of ink pressure chambers 25 between the nozzle plate 21 and the substrate 22. The substrate 22 has a partition wall arranged between the plurality of ink pressure chambers 25 in the same row. An actuator 24 having electrodes 24a and 24b is arranged at a portion of the substrate 22 facing each ink pressure chamber 25.

The actuator 24 is arranged to face the nozzle hole 21a, and the ink pressure chamber 25 is formed between the actuator 24 and the nozzle hole 21a. The actuator 24 is connected to a drive circuit. The liquid discharge head 20 discharges the liquid from the nozzle hole 21a facing the actuator 24 by deforming the actuator 24 in response to a voltage under the control of the module controller 38.

Next, the circulation device 30 is described.

As shown in FIG. 2, the circulation device 30 is integrally connected to an upper part of the liquid discharge head 20 by metal connecting parts. The circulation device 30 includes a predetermined circulation path 31 configured to be capable of circulating the liquid through the liquid discharge head 20, an intermediate tank 32 that is an adjustment tank provided, the first circulation pump 33, a bypass flow path 34, a buffer tank 35 as a buffer device 100, the second circulation pump 36, an on-off valve 37a, an on-off valve 37b and the module controller 38 for controlling a liquid discharge operation, which are arranged in order along the circulation path 31.

The circulation device 30 also has a cartridge 51 as a replenishing tank provided at the outside of the circulation path 31, a supply path 52 and a replenishing pump 53.

The cartridge 51 is configured to be capable of storing ink to be supplied to the intermediate tank 32, and an air chamber therein is opened to the atmosphere.

The supply path 52 connects the intermediate tank 32 to the cartridge 51. The supply path 52 includes a pipe made of metal or resin material and a tube covering an outer surface of the pipe. The tube covering the outer surface of the pipe of the supply path 52 is, for example, a PTFE (Poly Tetra Fluoroethylene) tube.

The replenishing pump 53 is arranged in the supply path 52 to feed the ink in the cartridge 51 to the intermediate tank 32.

First, the circulation path 31 is described.

The circulation path 31 includes a first flow path 31a, a second flow path 31b, a third flow path 31c and a fourth flow path 31d. The first flow path 31a connects the intermediate tank 32 to the first circulation pump 33. The second flow path 31b connects the first circulation pump 33 to the supply port 20a of the liquid discharge head 20. The third flow path 31c connects the collection port 20b of the liquid discharge head 20 to the second circulation pump 36. The fourth flow path 31d connects the second circulation pump 36 to the intermediate tank 32.

The ink circulating through the circulation path 31 passes through the first flow path 31a, the first circulation pump 33, the second flow path 31b, and the supply port 20a of the liquid discharge head 20 from the intermediate tank 32 to reach the inside of the liquid discharge head 20. The ink circulating through the circulation path 31 passes through the collection port 20b of the liquid discharge head 20, the third flow path 31c, the second circulation pump 36 and the fourth flow path 31d from the liquid discharge head 20 to reach the intermediate tank 32.

A first pressure sensor 39a which is a first pressure detection section is provided in the second flow path 31b. The first pressure sensor 39a detects pressure of the ink in the second flow path 31b and transmits the detection data to the module controller 38.

A second pressure sensor 39b which is a second pressure detection section is provided in the third flow path 31c. The second pressure sensor 39b detects pressure of the ink in the third flow path 31c and transmits the detection data to the module controller 38.

The first pressure sensor 39a and the second pressure sensor 39b output the pressure as an electric signal using a semiconductor piezoresistive pressure sensor, for example. The semiconductor piezoresistive pressure sensor includes a diaphragm for receiving an external pressure and a semiconductor strain gauge formed on the surface of the diaphragm. The semiconductor piezoresistive pressure sensor detects the pressure by converting the change in the electrical resistance caused by the piezoresistance effect generated in the strain gauge as the diaphragm is deformed due to the external pressure to an electric signal.

Next, the intermediate tank 32 is described.

The intermediate tank 32 is connected to the liquid discharge head 20 via the circulation path 31 to be capable of storing the liquid. In the intermediate tank 32, an on-off valve 37a through which an air chamber in the intermediate tank 32 can open to the atmosphere is provided. On the liquid surface of the intermediate tank 32, a liquid level sensor 54 is provided.

The liquid level sensor 54 includes a float 55 floating on the liquid surface and moving up and down, and Hall ICs (Integrated Circuits) 56a and 56b provided at two predetermined positions at the upper and lower portions. The liquid level sensor 54 detects an amount of the ink in the intermediate tank 32 by detecting that an upper limit position and a lower limit position of the float 55 using the Hall ICs 56a and 56b, and transmits the detected data to the module controller 38.

The on-off valve 37a is provided in the intermediate tank 32. The on-off valve 37a is a normally closed solenoid on-off valve which is opened when a power supply is turned on and is closed when the power supply is turned off. The on-off valve 37a is opened and closed under the control of the module controller 38 so that the air chamber of the intermediate tank 32 can be opened and closed with respect to the atmosphere.

Next, the first circulation pump 33 and the second circulation pump 36 are described.

The first circulation pump 33 is used to feed the liquid. The first circulation pump 33 feeds the liquid from the first flow path 31a towards the second flow path 31b. Specifically, the first circulation pump 33 is a booster pump which sucks the ink from the intermediate tank 32 which is the ink replenishing tank by the operation of the actuator to supply it to the liquid discharge head 20.

The second circulation pump 36 is used to feed the liquid. The second circulation pump 36 feeds the liquid from the third flow path 31c towards the fourth flow path 31d. Specifically, the second circulation pump 36 is a pressure reducing pump for collecting the ink from the liquid discharge head 20 by the operation of the actuator to supply it to the intermediate tank 32.

The first circulation pump 33 and the second circulation pump 36 are configured as a piezoelectric pump 60 as shown in FIG. 4, for example. The piezoelectric pump 60 includes a pump chamber 58, a piezoelectric actuator 59 provided in the pump chamber 58 to vibrate when applied with a voltage, and check valves 61 and 62 arranged at an inlet and an outlet of the pump chamber 58. The piezoelectric actuator 59 is capable of vibrating at a frequency of, for example, about 50 Hz to 200 Hz. The first circulation pump 33 and the second circulation pump 36 are connected to the drive circuit by a wiring and can operate under the control of the module controller 38.

For example, as the voltage applied to the piezoelectric actuator 59 changes, as shown in the upper and lower drawings of FIG. 4, the piezoelectric actuator 59 is deformed in a direction to contract the pump chamber 58 or in a direction to expand the pump chamber 58. As a result, a volume of the pump chamber 58 changes. For example, when the piezoelectric actuator 59 is deformed in the direction to expand the pump chamber 58, the check valve 61 at the inlet of the pump chamber 58 opens to suck the ink into the pump chamber 58. For example, when the piezoelectric actuator 59 is deformed in the direction to contract the pump chamber 58, the check valve 62 at the outlet of the pump chamber 58 opens to feed the ink in the pump chamber 58 towards the other side. By repeating the operation, the first circulation pump 33 and the second circulation pump 36 suck the ink from one side and feed the ink from the other side.

A maximum change amount of the piezoelectric actuator 59 varies depending on the voltage applied to the piezoelectric actuator 59. If the voltage applied to the piezoelectric actuator 59 increases, the maximum change amount of the piezoelectric actuator 59 increases. If the voltage applied to the piezoelectric actuator 59 decreases, the maximum change amount of the piezoelectric actuator 59 decreases. The liquid feed capability of the piezoelectric pump 60 varies depending on the maximum change amount of the piezoelectric actuator 59. In other words, the module controller 38 controls the liquid feed capability of the piezoelectric pump 60 by controlling the voltage applied to the piezoelectric actuator 59.

The piezoelectric actuator 59 of the piezoelectric pump 60 has such a characteristic that a potential of an electrode thereof gradually increases or decreases in accordance with elapsed time since energization such as charge or discharge is started.

Figure 5:
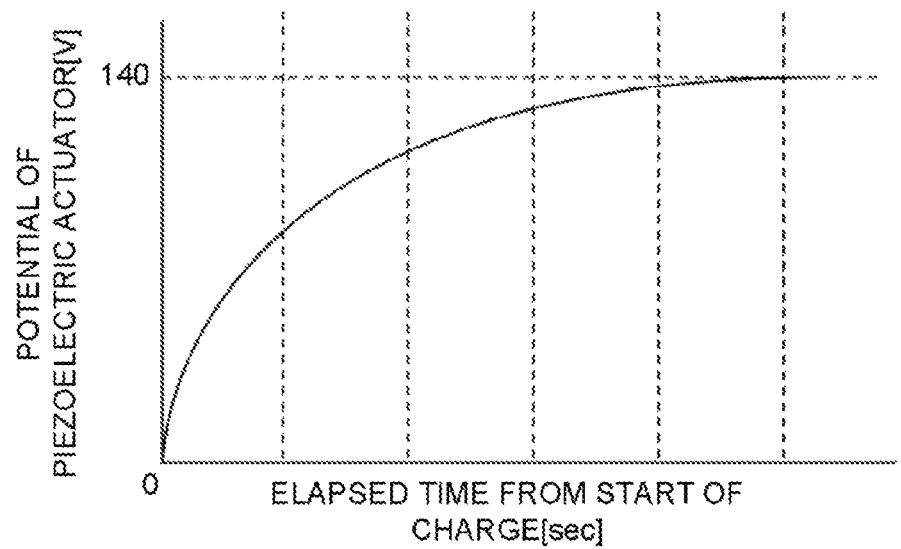
FIG. 5 is a diagram illustrating a relationship between a potential of an electrode of a piezoelectric actuator and the time according to the embodiment.

FIG. 5 is a diagram illustrating a relationship between the elapsed time from the start of a charge state in which the electric charge is supplied and a potential of the electrode of the piezoelectric actuator 59. As shown in FIG. 5, at the time of charge, a potential difference between two terminals of the piezoelectric actuator 59 gradually increases after the charge is started, and is fixed at the voltage to be supplied when a predetermined period of time elapses since the charge is started.

Figure 6:
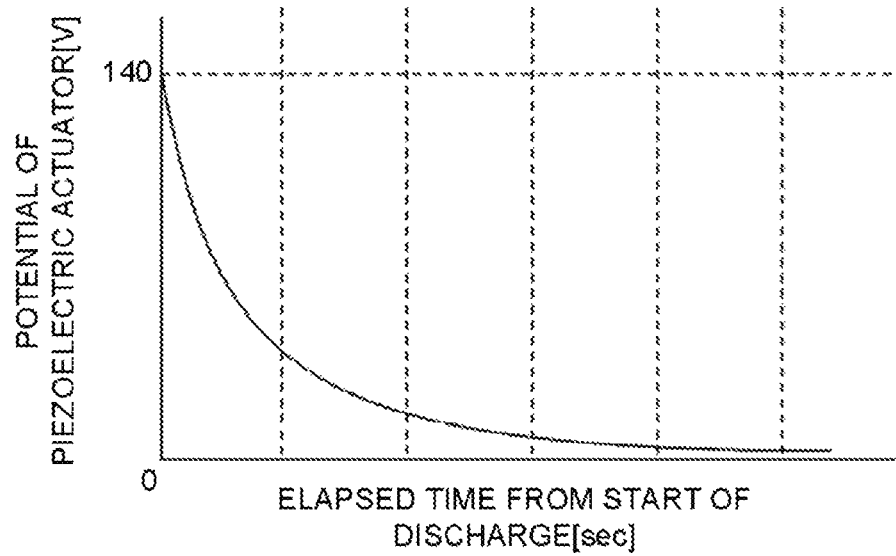
FIG. 6 is a diagram illustrating a relationship between a potential of the electrode of the piezoelectric actuator and the time according to the embodiment.

FIG. 6 is a diagram illustrating a relationship between the elapsed time from the start of a discharge state where the electric charge is removed and the potential of the electrode of the piezoelectric actuator 59. As shown in FIG. 6, at the time of discharge, the potential difference between the two terminals of the piezoelectric actuator 59 gradually decreases from the charge state, and is fixed at 0 V when a predetermined period of time elapses since the discharge is started.

Next, the bypass flow path 34 and the buffer tank 35 are described.

The bypass flow path 34 connects the second flow path 31*b* and the third flow path 31*c*. The bypass flow path 34 connects the supply port 20*a* which is a primary side of the liquid discharge head 20 in the circulation path 31 to the collection port 20*b* which is a secondary side of the liquid discharge head 20 through a deficient circuit without using the liquid discharge head 20.

The buffer tank 35 is connected to the bypass flow path 34. Specifically, the bypass flow path 34 includes a first bypass flow path 34*a* connecting a predetermined portion at a lower part of one of the pair of side walls of the buffer tank 35 to the second flow path 31*b*, and a second bypass flow path 34*b* connecting a predetermined portion at a lower part of the other one of the pair of side walls of the buffer tank 35 to the third flow path 31*c*.

For example, the first bypass flow path 34*a* and the second bypass flow path 34*b* have the same length and the same diameter, both of which have smaller diameter than that of the circulation path 31. For example, the diameter of the circulation path 31 is set to about 2 to 5 times larger than the diameter of each of the first bypass flow path 34*a* and the second bypass flow path 34*b*. The first bypass flow path 34*a* and the second bypass flow path 34*b* are arranged in such a manner that a distance between a connection position of the second flow path 31*b* and the first bypass flow path 34*a* and the supply port 20*a* of the liquid discharge head 20 becomes equal to a distance between a connection position of the third flow path 31*c* and the second bypass flow path 34*b* and the collection port 20*b* of the liquid discharge head 20.

The buffer tank 35 has a flow path cross-sectional area larger than that of the bypass flow path 34 to be capable of storing the liquid. The buffer tank 35 has, for example, a rectangular box shape, which has an upper wall, a lower wall, a rear wall, a front wall, and a pair of left and right side walls and includes a storage chamber 35*a* for storing the liquid therein. The on-off valve 37*b* through which an air chamber in the buffer tank 35 can open to the atmosphere is provided in the buffer tank 35. The connection position of the first bypass flow path 34*a* and the buffer tank 35 and the connection position of the second bypass flow path 34*b* and the buffer tank 35 are set at the same height. At a lower region of the storage chamber 35*a* in the buffer tank 35, the ink flowing through the bypass flow path 34 is stored, and at the upper region of the storage chamber 35*a*, the air chamber is formed. Specifically, the buffer tank 35 can store a predetermined amount of liquid and air.

The on-off valve 37*b* is provided in the buffer tank 35. The on-off valve 37*b* is a normally closed solenoid on-off valve which is opened when a power supply is turned on and is closed when the power supply is turned off. The on-off valve 37*b* is opened and closed under the control of the module controller 38 so as to open and close the air chamber of the buffer tank 35 with respect to the atmosphere.

Next, the module controller 38 is described.

Figure 7:
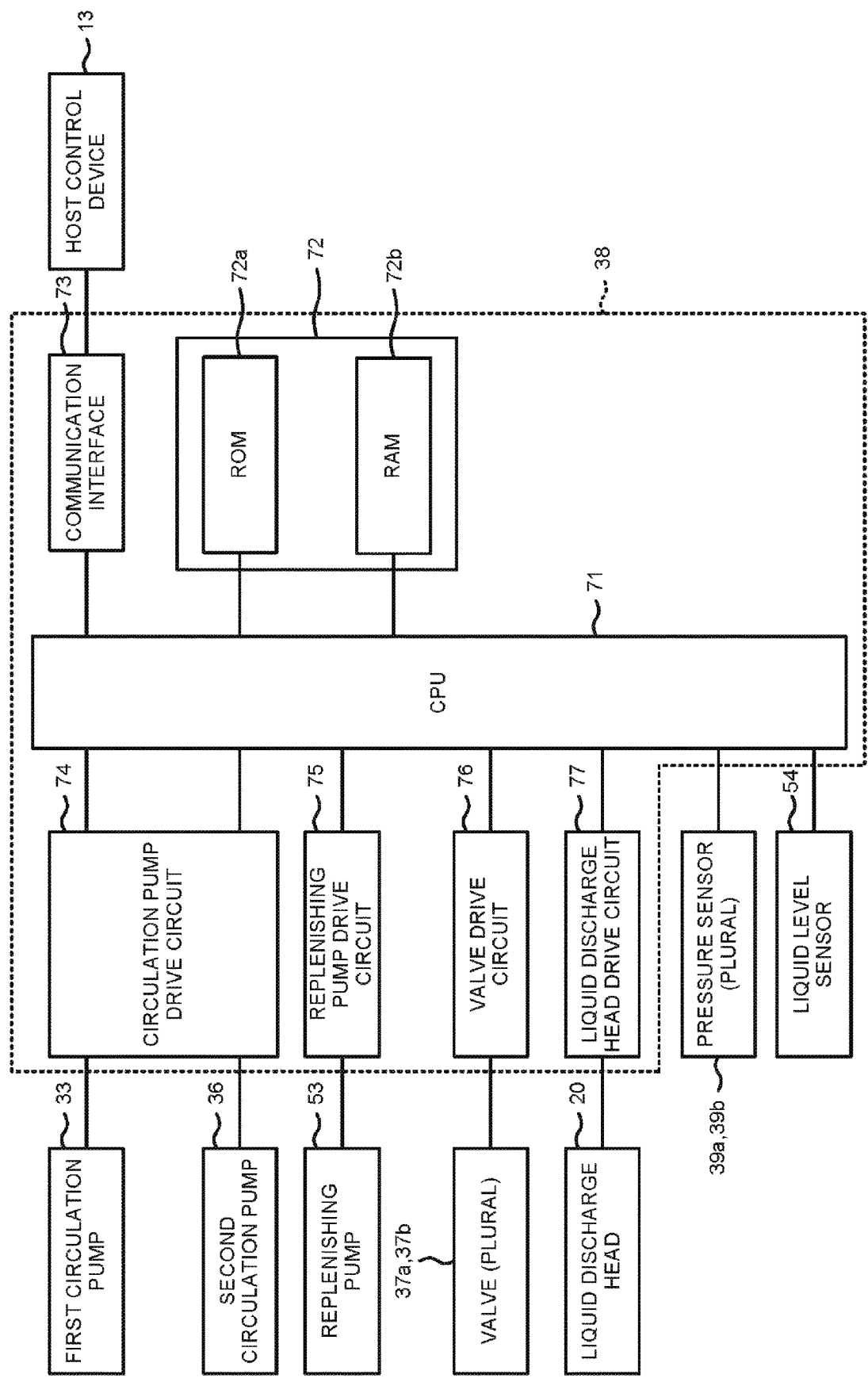
FIG. 7 is a diagram illustrating an example of a configuration of a module controller according to the embodiment.

FIG. 7 is a diagram illustrating an example of a configuration of the module controller 38.

The module controller 38 controls operations of the liquid discharge head 20, the first circulation pump 33, the second circulation pump 36, the on-off valve 37*a*, the on-off valve 37*b* and the replenishing tank 53. The module controller 38 includes a CPU (Central Processing Unit) 71, a memory 72, a communication interface 73, a circulation pump drive circuit 74, a replenishing pump drive circuit 75, a valve drive circuit 76 and a liquid discharge head drive circuit 77.

The CPU 71 is an arithmetic element (e.g., a processor) that executes an arithmetic processing. The CPU 71 performs various processing based on data such as programs stored in the memory 72. By executing the program stored in the memory 72, the CPU 71 functions as a control circuit capable of executing various kinds of control.

The memory 72 stores various kinds of information. The memory 72 includes, for example, a ROM (Read Only Memory) 72*a*, and a RAM (Random Access Memory) 72*b*.

The ROM 72*a* is a read-only nonvolatile memory. The ROM 72*a* stores programs and data used for the programs. For example, the ROM 72*a* stores various setting values such as a calculation formula for calculating ink pressure of the nozzle hole 21*a*, a target pressure range, an adjustment maximum value of each pump and the like as the control data used for the pressure control.

The RAM 72b is a volatile memory functioning as a working memory. The RAM 72b temporarily stores data being processed by the CPU 71. The RAM 72b temporarily stores programs to be executed by the CPU 71.

The communication interface 73 is used for communicating with other devices. The communication interface 73 relays communication with the host control device 13 that transmits print data to the liquid discharge device 10, for example.

Under the control of the CPU 71, the circulation pump drive circuit 74 drives the first circulation pump 33 and the second circulation pump 36 to circulate the ink in the circulation path 31.

The replenishing pump drive circuit 75 drives the replenishing pump 53 under the control of the CPU 71 to replenish the ink in the cartridge 51 to the intermediate tank 32.

Under the control of the CPU 71, the valve drive circuit 76 drives the on-off valve 37a and the on-off valve 37b to open the air chambers of the intermediate tank 32 and the buffer tank 35 to the atmosphere.

Under the control of the CPU 71, the liquid discharge head drive circuit 77 applies a voltage to the actuator 24 of the liquid discharge head 20 to drive the liquid discharge head 20 to discharge the ink from the nozzle hole 21a of the liquid discharge head 20.

In the above configuration, the CPU 71 communicates with the host control device 13 via the communication interface 73 to receive various kinds of information such as an operation condition. Various kinds of information acquired by the CPU 71 are transmitted to the host control device 13 of the inkjet recording apparatus 1 via the communication interface 73.

The CPU 71 acquires detection results from the first pressure sensor 39a, the second pressure sensor 39b and the liquid level sensor 54, and controls the operations of the circulation pump drive circuit 74, the replenishing pump drive circuit 75 and the valve drive circuit 76 based on the acquired detection results.

For example, the CPU 71 controls the circulation pump drive circuit 74 based on the detection results from the first pressure sensor 39a, the second pressure sensor 39b and the liquid level sensor 54 to control the liquid feed capability of the first circulation pump 33 and the second circulation pump 36. As a result, the CPU 71 adjusts the ink pressure in the nozzle hole 21a.

The CPU 71 operates the replenishing pump 53 by controlling the replenishing pump drive circuit 75 based on the detection results from the first pressure sensor 39a, the second pressure sensor 39b and the liquid level sensor 54 to replenish the liquid from the cartridge 51 to the circulation path 31.

The CPU 71 opens and closes the on-off valve 37a and the on-off valve 37b by controlling the valve drive circuit 76. As a result, the CPU 71 adjusts the liquid levels of the intermediate tank 32 and the buffer tank 35.

The CPU 71 acquires the detection results from the first pressure sensor 39a, the second pressure sensor 39b and the liquid level sensor 54 and controls the liquid discharge head drive circuit 77 based on the acquired detection results to discharge ink droplets onto an image receiving medium from the nozzle hole 21a of the liquid discharge head 20. Specifically, the CPU 71 inputs an image signal corresponding to image data to the liquid discharge head drive circuit 77. The liquid discharge head drive circuit 77 drives the actuator 24 of the liquid discharge head 20 in response to the image signal. If the liquid discharge head drive circuit 77 drives the actuator 24 of the liquid discharge head 20, the actuator 24 is deformed, and the ink pressure (nozzle surface pressure) of the nozzle hole 21a facing the actuator 24 changes. The nozzle surface pressure is applied by the ink in the ink pressure chamber 25 to a meniscus Me formed by the ink in the nozzle hole 21a. If the nozzle surface pressure exceeds a predetermined value determined according to a shape of the nozzle hole 21a and characteristics of the ink, the ink is discharged from the nozzle hole 21a. As a result, the CPU 71 forms an image corresponding to the image data on the image receiving medium.

Next, the circulation pump drive circuit 74 is described in detail.

Figure 8:
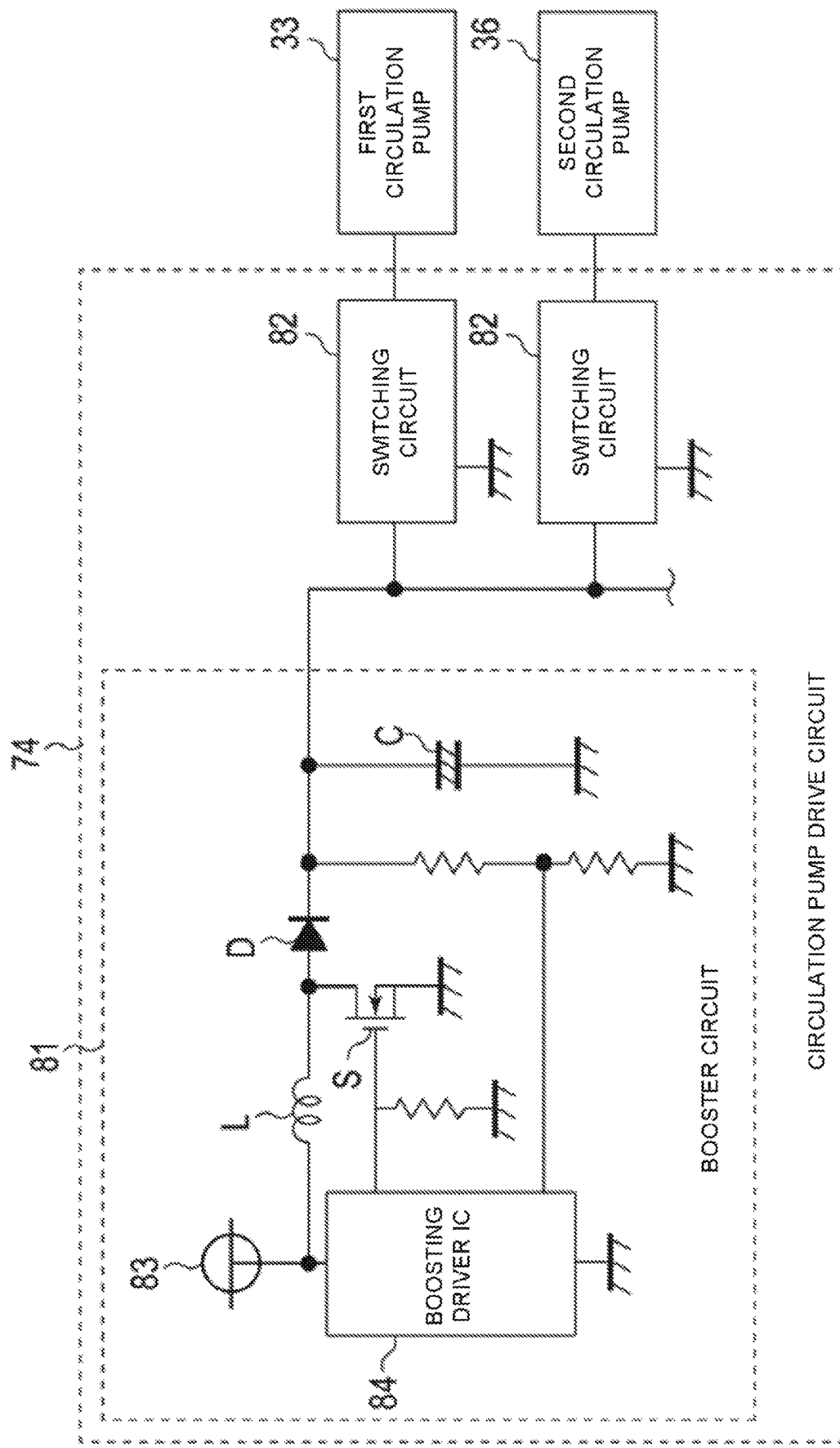
FIG. 8 is a diagram illustrating an example of a configuration of a circulation pump drive circuit according to the embodiment.

FIG. 8 is a diagram illustrating an example of a configuration of the circulation pump drive circuit 74. The circulation pump drive circuit 74 includes one booster circuit 81 and a plurality of the switching circuits 82 provided for each pump.

The booster circuit 81 boosts a voltage supplied from a low-voltage power supply 83 to a desired voltage. The booster circuit 81 includes an inductor L, a switching element S, a rectifier diode D, a smoothing capacitor C and a boosting driver IC 84.

One terminal of the inductor L is connected to the low-voltage power supply 83, and the other terminal thereof is connected to an anode of the rectifier diode D.

The smoothing capacitor C is connected between a cathode of the rectifier diode D and GND (Ground).

Under the control of the boosting driver IC 84, the switching element S operates to connect or disconnect a connection point between the inductor L and the rectifier diode D to or from the GND.

The boosting driver IC 84 turns on or off the switching element S. By inputting a high-frequency pulse to the switching element S, the boosting driver IC 84 turns on or off the switching element S at a high speed, thereby generating a voltage higher than the voltage of the low-voltage power supply 83 in the smoothing capacitor C. As a result, the booster circuit 81 functions as a DC power supply for supplying a DC voltage higher than the voltage of the low-voltage power supply 83 to a subsequent circuit.

Under the control of the CPU 71, the switching circuit 82 supplies the driving voltage to the piezoelectric actuator 59 of the piezoelectric pump 60 by switching the output of the booster circuit 81 which is the DC power supply. Under the control of the CPU 71, the switching circuit 82 controls the switching timing to change the liquid feed capability of the piezoelectric pump 60. For example, the switching circuit 82 connected to the first circulation pump 33 changes the liquid feed capability of the first circulation pump 33 which is the booster pump under the control of the CPU 71. The switching circuit 82 connected to the second circulation pump 36 changes the liquid feed capability of the second circulation pump 36 which is the pressure reducing pump under the control of the CPU 71. Since the switching circuit 82 connected to the first circulation pump 33 and the switching circuit 82 connected to the second circulation pump 36 have the same configuration, the switching circuit 82 connected to the first circulation pump 33 is described as an example.

Figure 9:
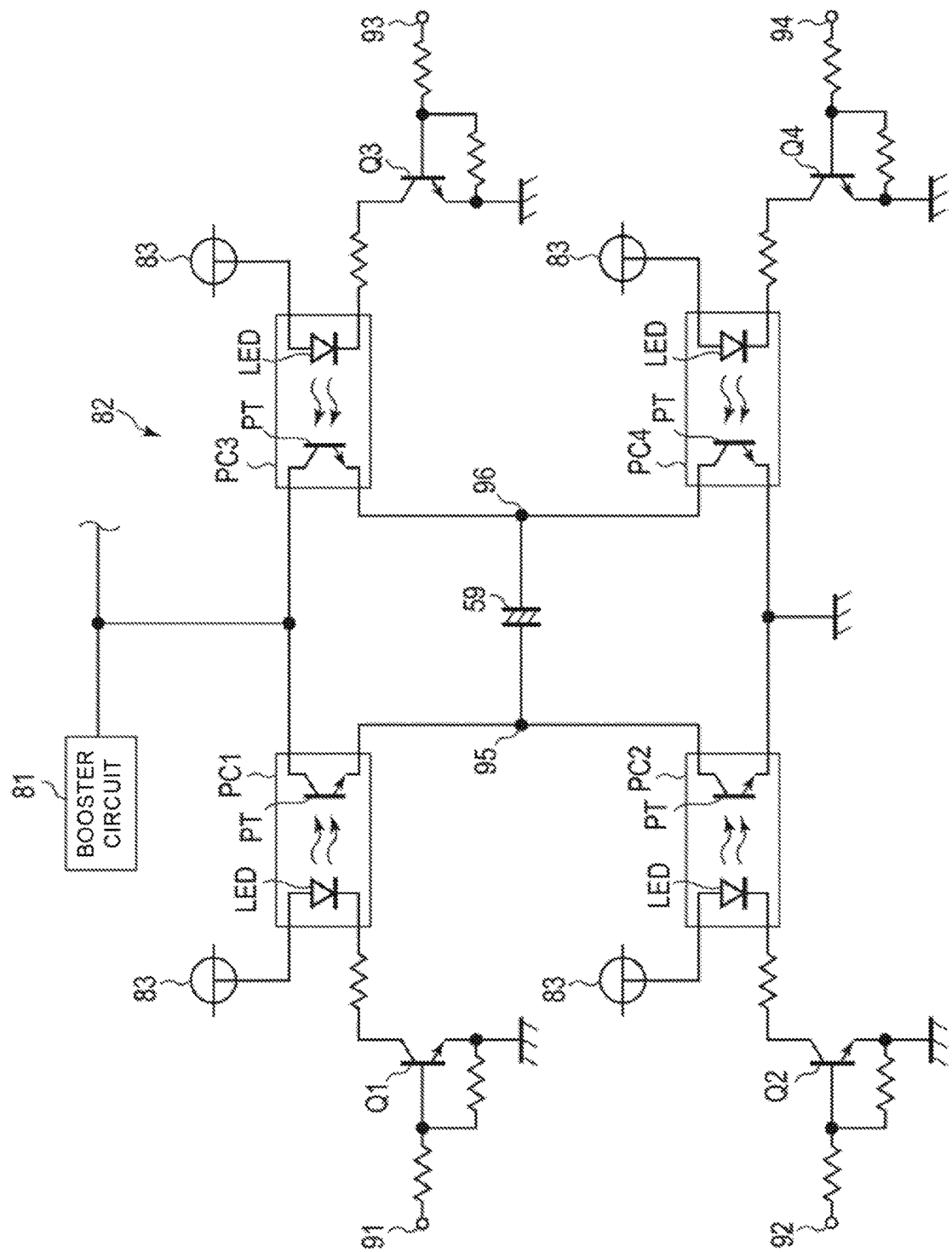
FIG. 9 is a diagram illustrating an example of a configuration of a switching circuit according to the embodiment.

FIG. 9 is a diagram illustrating an example of a configuration of the switching circuit 82. The switching circuit 82 is connected between the output terminal of the booster circuit 81 and the GND. The switching circuit 82 includes a first input terminal 91, a second input terminal 92, a third input terminal 93 and a fourth input terminal 94, to which pulse signals output from the CPU 71 are input. The switching circuit 82 comprises a first output terminal 95 connected to one terminal of the piezoelectric actuator 59 of the piezoelectric pump 60, and a second output terminal 96 connected to the other terminal of the piezoelectric actuator 59. Furthermore, the switching circuit 82 includes a first photocoupler PC1, a second photocoupler PC2, a third photocoupler PC3, a fourth photocoupler PC4, a first switching element Q1, a second switching element Q2, a third switching element Q3 and a fourth switching element Q4.

The first photocoupler PC1, the second photocoupler PC2, the third photocoupler PC3 and the fourth photocoupler PC4 each include a light emitting diode LED, a phototransistor PT, and the like. In the photocoupler, when a current flows from the anode to the cathode of the light emitting diode LED and the light emitting diode LED emits light, the light enters the phototransistor PT, and collector-emitter of the phototransistor PT becomes a conduction state.

The first switching element Q1, the second switching element Q2, the third switching element Q3 and the fourth switching element Q4 are semiconductor switches, and, for example, are npn-type transistors. The first switching element Q1, the second switching element Q2, the third switching element Q3 and the fourth switching element Q4 may be n-type MOSFETs (Metal-Oxide-Semiconductor Field-Effect Transistors).

A base (control terminal) of the first switching element Q1 is connected to the first input terminal 91. A collector of the first switching element Q1 is connected to the cathode of the light emitting diode LED of the first photocoupler PC1. An emitter of the first switching element Q1 is connected to the GND. The anode of the light emitting diode LED of the first photocoupler PC1 is connected to the low-voltage power supply 83. A collector of the phototransistor PT of the first photocoupler PC1 is connected to an output terminal of the booster circuit 81. An emitter of the phototransistor PT of the first photocoupler PC1 is connected to the first output terminal 95.

A base (control terminal) of the second switching element Q2 is connected to the second input terminal 92. A collector of the second switching element Q2 is connected to the cathode of the light emitting diode LED of the second photocoupler PC2. An emitter of the second switching element Q2 is connected to the GND. The anode of the light emitting diode LED of the second photocoupler PC2 is connected to the low-voltage power supply 83. A collector of the phototransistor PT of the second photocoupler PC2 is connected to the first output terminal 95. An emitter of the phototransistor PT of the second photocoupler PC2 is connected to the GND.

A base (control terminal) of the third switching element Q3 is connected to the third input terminal 93. A collector of the third switching element Q3 is connected to the cathode of the light emitting diode LED of the third optocoupler PC3. An emitter of the third switching element Q3 is connected to the GND. The anode of the light emitting diode LED of the third photocoupler PC3 is connected to the low-voltage power supply 83. A collector of the phototransistor PT of the third photocoupler PC3 is connected to an output terminal of the booster circuit 81. An emitter of the phototransistor PT of the third photocoupler PC3 is connected to the second output terminal 96.

A base (control terminal) of the fourth switching element Q4 is connected to the fourth input terminal 94. A collector of the fourth switching element Q4 is connected to the cathode of the light emitting diode LED of the fourth photocoupler PC4. An emitter of the fourth switching element Q4 is connected to the GND. The anode of the light emitting diode LED of the fourth photocoupler PC4 is connected to the low-voltage power supply 83. A collector of the phototransistor PT of the fourth photo-coupler PC4 is connected to the second output terminal 96. An emitter of the phototransistor PT of the fourth photocoupler PC4 is connected to the GND.

As described above, in the piezoelectric actuator 59 constituting the piezoelectric pump 60, both electrodes thereof constitute a part of a full bridge converter.

Next, the control of the switching circuit 82 by the CPU 71 is described.

The CPU 71 generates a first pulse signal PLS1 and a second pulse signal PLS2 based on the detection results of the liquid level sensor 54, the first pressure sensor 39*a* and the second pressure sensor 39*b*. The CPU 71 inputs the first pulse signal PLS1 to the first input terminal 91 and the fourth input terminal 94 of the switching circuit 82 configured as described above, and inputs the second pulse signal PLS2 to the second input terminal 92 and the third input terminal 93 of the switching circuit 82. Thus, the CPU 71 turns on or off the first photocoupler PC1, the second photocoupler PC2, the third photocoupler PC3, the fourth photocoupler PC4, the first switching element Q1, the second switching element Q2, the third switching element Q3 and the fourth switching element Q4.

Figure 10:
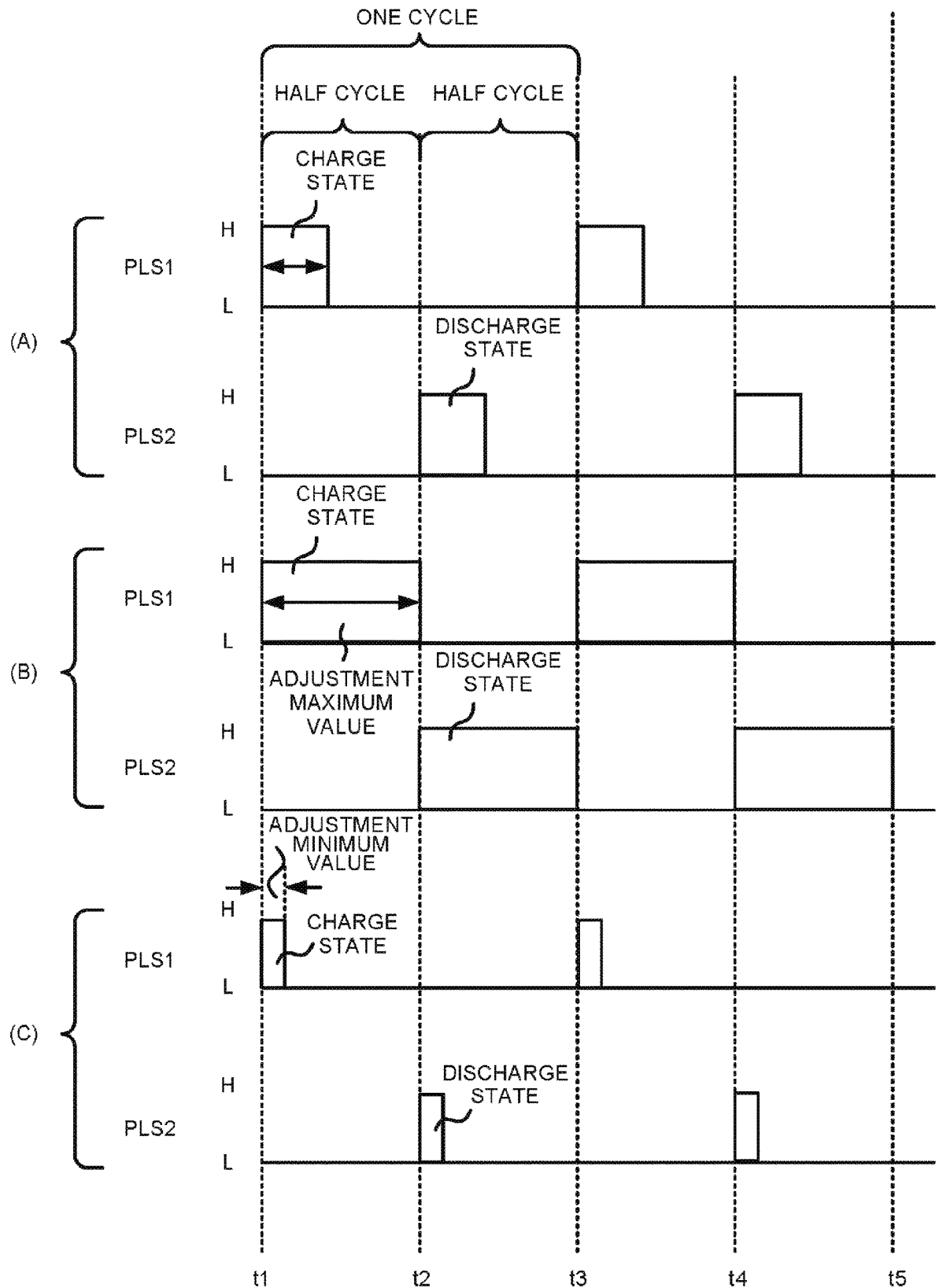
FIG. 10 is a diagram illustrating an example of a pulse signal input to the switching circuit according to the embodiment.

FIG. 10 is a diagram illustrating examples of the first pulse signal PLS1 and the second pulse signal PLS2.

The first pulse signal PLS1 and the second pulse signal PLS2 each become H level at least once in one cycle. The first pulse signal PLS1 and the second pulse signal PLS2 are controlled so as not to become H level simultaneously. Specifically, the first pulse signal PLS1 becomes H level in the first half cycle and becomes L level in the second half cycle. The second pulse signal PLS2 is becomes L level in the first half cycle and becomes H level in the second half cycle. Specifically, the first pulse signal PLS1 and the second pulse signal PLS2 are controlled so that a length of H level thereof is less than the half cycle.

As shown in FIG. 10 (A), the first pulse signal PLS1 becomes H level at a timing t1, and becomes L level in a period from the timing t1 to a timing t2. The first pulse signal PLS1 again becomes H level at a timing t3 and becomes L level in a period from the timing t3 to a timing t4.

As shown in FIG. 10 (A), the second pulse signal PLS2 becomes L level at the timing t1, becomes H level at the timing t2, and becomes L level in a period from the timing t2 to the timing t3. The second pulse signal PLS2 again becomes H level at the timing t4 and becomes L level in a period from the timing t4 to a timing t5.

If the first pulse signal PLS1 is at H level and the second pulse signal PLS2 is at L level, the first switching element Q1 and the fourth switching element Q4 in FIG. 9 are turned on, and the second switching element Q2 and the third switching element Q3 are turned off. In this case, a current flows in anode-cathode of the first photocoupler PC1 and the fourth photocoupler PC4, the light emitting diode LED emits light, and the collector-emitter of the phototransistor PT is conducted. Since the current does not flow in anode-cathode of the second photocoupler PC2 and the third photocoupler PC3, the collector-emitter of the phototransistor PT is not conducted. As a result, the current flows through the booster circuit 81, the first photocoupler PC1, the first output terminal 95, the piezoelectric actuator 59, the second output terminal 96, the fourth photocoupler PC4 and the GND in order. In other words, in the charge state, the piezoelectric actuator 59 is charged with the high voltage supplied from the booster circuit 81.

When the first pulse signal PLS1 is at L level and the second pulse signal PLS2 is at H level, the second switching element Q2 and the third switching element Q3 in FIG. 9 are turned on, and the first switching element Q1 and the fourth switching element Q4 are turned off. In this case, a current flows in the anode-cathode of the second photocoupler PC2 and the third photocoupler PC3, the light emitting diode LED emits light, and the collector-emitter of the phototransistor PT is conducted. Since the current does not flow in the anode-cathode of the first photocoupler PC1 and the fourth photocoupler PC4, the collector-emitter of the phototransistor PT is not conducted. As a result, the current flows through the booster circuit 81, the third photocoupler PC3, the second output terminal 96, the piezoelectric actuator 59, the first output terminal 95, the second photocoupler PC2 and the GND in order. In other words, in the discharge state, a voltage in a direction opposite to that in the charge state is applied to the piezoelectric actuator 59, and the electric charge accumulated in the piezoelectric actuator 59 is removed.

The CPU 71 supplies the first pulse signal PLS1 and the second pulse signal PLS2 described above to the switching circuit 82, and in this way, the direction of the high voltage supplied from the booster circuit 81 to the piezoelectric actuator 59 is switched between a direction from the first output terminal 95 to the second output terminal 96 and a direction from the second output terminal 96 to the first output terminal 95. As a result, the CPU 71 repeats the charge operation and the discharge operation of the piezoelectric actuator 59.

As described above, the potential of the piezoelectric actuator 59 gradually increases or decreases in accordance with the elapsed time from the start of the charge or the discharge. The CPU 71 controls the potential of the piezoelectric actuator 59 by controlling the length of H level of the first pulse signal PLS1 and the length of H level of the second pulse signal PLS2. If the potential difference between the two electrodes of the piezoelectric actuator 59 is large, the liquid feed capability becomes strong; contrarily, when the potential difference is small, the liquid feed capability becomes weak. As described above, the CPU 71 controls the potential of the piezoelectric actuator 59 by changing the length of a period in which the switching element is turned on, thereby controlling the liquid feed capability of the piezoelectric pump 60. Specifically, the CPU 71 lengthens the length of H level of each of the first pulse signal PLS1 and the second pulse signal PLS2 to increase amplitude of the piezoelectric actuator 59, thereby increasing the liquid feed capability of the piezoelectric pump 60. The CPU 71 reduces the length of H level of each of the first pulse signal PLS1 and the second pulse signal PLS2 to decrease the amplitude of the piezoelectric actuator 59, thereby weakening the liquid feed capability of the piezoelectric pump 60.

The CPU 71 controls the length of H level of each of the first pulse signal PLS1 and the second pulse signal PLS2 between the length shown in FIG. 10(B) and the length shown in FIG. 10(C). As shown in FIG. 10(B), a maximum value (adjustment maximum value) of the length of H level of each of the first pulse signal PLS1 and the second pulse signal PLS2 is less than the half cycle thereof. As shown in FIG. 10 (C), a minimum value (adjustment minimum value) of the length of H level of each of the first pulse signal PLS1 and the second pulse signal PLS2 is determined according to a specification of the piezoelectric actuator 59. The piezoelectric actuator 59 does not operate when a length of the charge state becomes less than a predetermined length determined according to the specification of the piezoelectric actuator 59. Therefore, the CPU 71 controls the length of H level of each of the first pulse signal PLS1 and the second pulse signal PLS2 within a range equal to or longer than the predetermined length and less than the half cycle.

In the present embodiment, for example, the CPU 71 controls the potential difference between the two electrodes of the piezoelectric actuator 59 from 50 V to 140 V. It is assumed that the frequency of each of the first pulse signal PLS1 and the second pulse signal PLS2 is 100 Hz. In this case, the length of one cycle is 10 ms, and the length of the half cycle is 5 ms. The length of the charge state necessary for the piezoelectric actuator 59 to operate is 200 μs. In this case, the CPU 71 controls the potential of the piezoelectric actuator 59 by changing the length of H level of each of the first pulse signal PLS1 and the second pulse signal PLS2 within a range of 200 μs≤H level <5 ms, thereby controlling the liquid feed capability of the piezoelectric pump 60.

Next, the control of the nozzle surface pressure by the CPU 71 of the module controller 38 is described.

In order to prevent the ink droplet from dripping from the nozzle hole 21a of the liquid discharge head 20 when the printing is not performed, the CPU 71 maintains the nozzle surface pressure of the nozzle hole 20a of the liquid discharge head 20 at a negative pressure. In the printing, the CPU 71 maintains the nozzle surface pressure (a pressure suitable for maintaining the meniscus Me) sufficient for discharging the ink droplet from the nozzle hole 21a of the liquid discharge head 20. The CPU 71 controls the liquid feed capability of the first circulation pump 33 and the second circulation pump 36 to control the nozzle surface pressure of the nozzle hole 21a of the liquid discharge head 20.

The nozzle surface pressure is increased or decreased by a relative relationship between the liquid feed capability of the first circulation pump 33 and the liquid feed capability of the second circulation pump 36. Specifically, when the liquid feed capability of the first circulation pump 33 is stronger than that of the second circulation pump 36, the nozzle surface pressure is increased. When the liquid feed capability of the first circulation pump 33 is weaker than that of the second circulation pump 36, the nozzle surface pressure is decreased.

Figure 11:
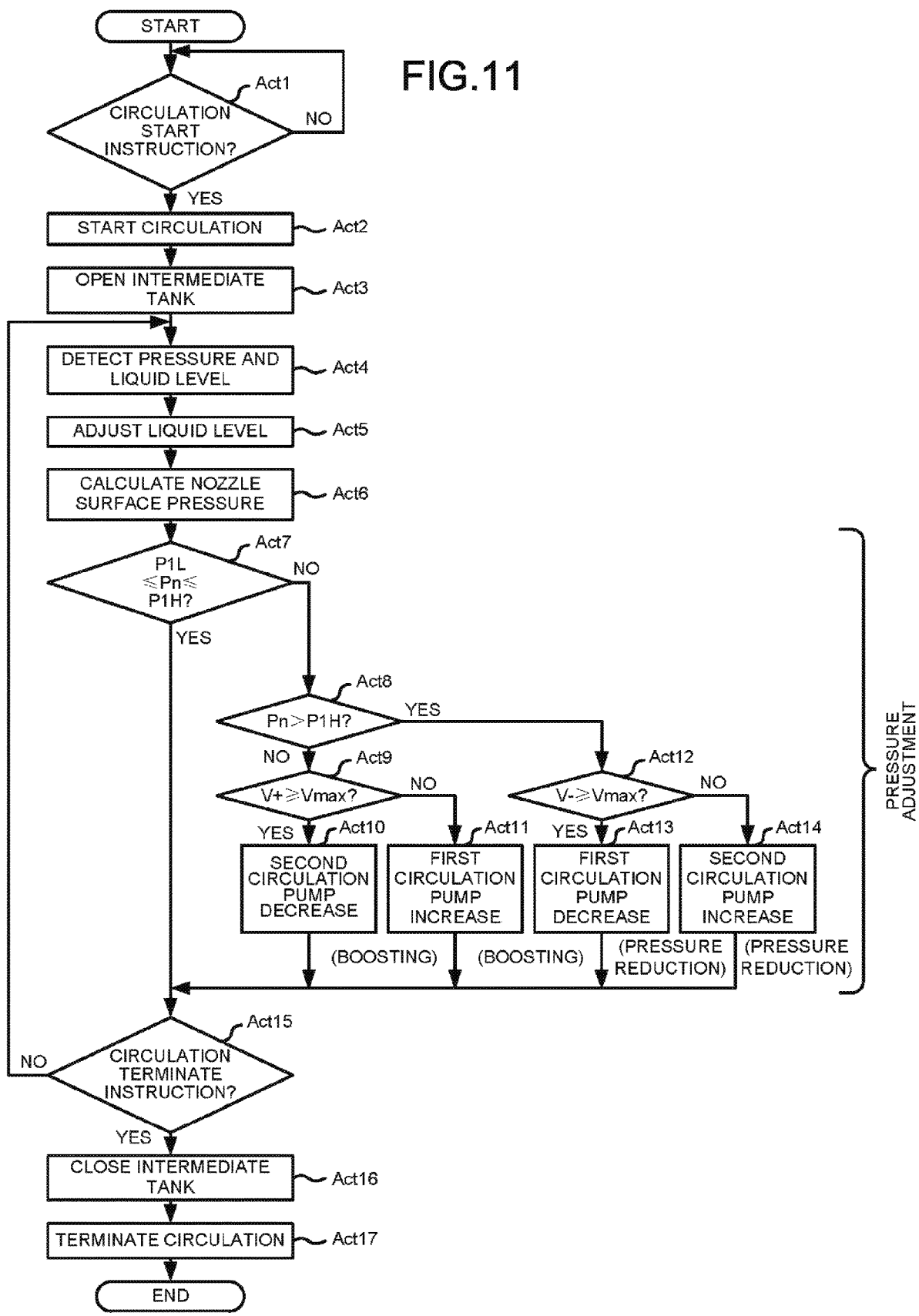
FIG. 11 is a diagram illustrating a nozzle surface pressure control by the module controller according to the embodiment.

FIG. 11 is a diagram illustrating the control of the nozzle surface pressure by the CPU 71 of the module controller 38.

In Act 1, the CPU 71 stands by until an instruction to start circulation is detected. For example, if the instruction to start circulation is detected from a command from the host control device 13 (Yes in Act 1), the CPU 71 proceeds to the processing in Act 2. In a printing operation, the host control device 13 performs an ink discharge operation while reciprocating the liquid discharge device 10 in a direction orthogonal to a conveyance direction of the image receiving medium S to form an image on the image receiving medium S. Specifically, the CPU 71 conveys a carriage 11a provided in the head support mechanism 11 in a direction towards the image receiving medium S and reciprocates it in a direction indicated by an arrow A. The CPU 71 supplies an image signal corresponding to image data to the liquid discharge head drive circuit 77 to drive the actuator 24 of the liquid discharge head 20 in response to the image signal to discharge the ink droplet onto the image receiving medium S from the nozzle hole 21a.

In Act 2, the CPU 71 drives the first circulation pump 33 and the second circulation pump 36 to start the ink circulation operation. The ink circulating through the circulation path 31 passes through the first flow path 31*a*, the first circulation pump 33, the second flow path 31*b*, and the supply port 20*a* of the liquid discharge head 20 from the intermediate tank 32 to reach the inside of the liquid discharge head 20. The ink circulating through the circulation path 31 passes through the collection port 20*b* of the liquid discharge head 20, the third flow path 31*c*, the second circulation pump 36, and the fourth flow path 31*d* from the liquid discharge head 20 to reach the intermediate tank 32.

In Act 3, the CPU 71 opens the on-off valve 37*a* of the intermediate tank 32 to the atmosphere. Since the intermediate tank 32 is open to the atmosphere and always has a constant pressure, it is possible to prevent the pressure in the circulation path in the liquid discharge head 20 from decreasing due to consumption of the ink. Here, if the on-off valve 37*a* is opened for a long period of time, and the temperature of the on-off valve 37*a* may rise, the on-off valve 37*a* may be periodically opened for a short period of time. Even if the on-off valve 37*a* is closed, it is possible to keep the ink pressure in the nozzle constant unless the pressure in the circulation path is excessively reduced. The on-off valve 37*a* of the solenoid type is normally closed. Therefore, even if the power supply of the device is suddenly stopped due to a power failure or the like, the on-off valve 37*a* can be closed instantaneously, and in this way, the intermediate tank 32 is cut off from the atmospheric pressure and the circulation path 31 is sealed. Therefore, it is possible to prevent the ink I from dripping from the nozzle hole 21*a* of the liquid discharge head 20.

In Act 4, the CPU 71 receives pressure data relating to the second flow path 31*b* and the third flow path 31*c* transmitted from the first pressure sensor 39*a* and the second pressure sensor 39*b*. The CPU 71 detects a liquid level of the intermediate tank 32 based on the data transmitted from the liquid level sensor 54.

In Act 5, the CPU 71 starts adjusting the liquid surface. Specifically, the CPU 71 drives the replenishing pump 53 based on the detection result from the liquid level sensor 54 to replenish the ink from the cartridge 51 and adjust the liquid surface position to an appropriate range. For example, at the time of printing, the CPU 71 replenishes the ink if the ink droplet is discharged from the nozzle hole 21*a*, the amount of the ink in the intermediate tank 32 instantaneously decreases, and the liquid surface falls. When the amount of the ink increases again and the output of the liquid level sensor 54 reverses, the CPU 71 stops the replenishing pump 53.

In Act 6, the CPU 71 detects the ink pressure of the nozzle from the pressure data. Specifically, based on the pressure data relating to an upstream side and a downstream side transmitted from the pressure sensor, the CPU 71 calculates the ink pressure of the nozzle hole 21*a* using a predetermined calculation formula.

First, if the density of the ink is $\rho$, an acceleration of gravity is g, and a distance in a height direction between a pressure measurement point and the nozzle surface is h, the pressure generated by a hydraulic head difference between the height of the pressure measurement point and the height of the nozzle surface is $\rho gh$. For example, the CPU 71 calculates ink pressure (nozzle surface pressure) Pn in the nozzle by adding the pressure $\rho gh$ to an average value between a pressure value Ph of the ink in the second flow path 31*b* and a pressure value Pl of the ink in the third flow path 31*c*.

The CPU 71 performs control to set the length of H level of each of the first pulse signal PLS1 and the second pulse signal PLS2 based on the calculated nozzle surface pressure Pn so that the nozzle surface pressure Pn becomes an appropriate value. In other words, by inputting the first pulse signal PLS1 and the second pulse signal PLS2 to the circulation pump drive circuit 74, the CPU 71 operates the first circulation pump 33 and the second circulation pump 36 to adjust the nozzle surface pressure Pn to an appropriate value.

The CPU 71 acquires the target pressure range of the nozzle surface pressure Pn from the ROM 72*a*. The target pressure range may be one value, or may have an upper limit value and a lower limit value. The CPU 71 may sequentially acquire the target pressure range from the host control device 13 via the communication interface 73. In this example, the target pressure range is described by assuming that it has the upper limit value and the lower limit value.

For example, it is assumed that the upper limit of the appropriate value (target value) of the nozzle surface pressure Pn is P1H and the lower limit thereof is P1L. The length of H level of each of the first pulse signal PLS1 and the second pulse signal PLS2 applied to the switching circuit 82 connected to the first circulation pump 33 is V+. The length of H level of each of the first pulse signal PLS1 and the second pulse signal PLS2 applied to the switching circuit 82 connected to the second circulation pump 36 is V−. Vmax is assumed as the maximum value (adjustment maximum value) of the length of H level of each of the first pulse signal PLS1 and the second pulse signal PLS2.

In Act 7, the CPU 71 determines whether or not the nozzle surface pressure Pn is within a proper range. Specifically, the CPU 71 determines whether or not the nozzle surface pressure Pn satisfies that P1L≤Pn≤P1H. If it is determined that the nozzle surface pressure Pn is beyond the appropriate range (NO in Act 7), the CPU 71 determines whether or not the nozzle surface pressure Pn exceeds P1H which is the upper limit of the target value in Act 8. In other words, the CPU 71 determines whether or not the nozzle surface pressure Pn satisfies that P1H<Pn.

If it is determined that the nozzle surface pressure Pn does not satisfy that P1H<Pn (No in Act 8), the CPU 71 determines whether or not V+ is equal to or greater than Vmax in Act 9. If it is determined that V+ is equal to or greater than Vmax (Yes in Act 9), the CPU 71 increases the nozzle surface pressure Pn by weakening the liquid feed capability of the second circulation pump 36 in Act 10. If it is determined that V+ is smaller than Vmax (No in Act 9), the CPU 71 increases the nozzle surface pressure Pn by increasing the liquid feed capability of the first circulation pump 33 in Act 11.

In other words, if it is determined that the nozzle surface pressure Pn is smaller than P1L, the CPU 71 increases the liquid feed capability of the first circulation pump 33 or weakens the liquid feed capability of the second circulation pump 36 to increase the nozzle surface pressure Pn. If it is determined that the nozzle surface pressure Pn is smaller than P1L and V+ reaches Vmax, the CPU 71 shortens V− to increase the nozzle surface pressure Pn. If it is determined that the nozzle surface pressure Pn is smaller than P1L and V+ does not reach Vmax, the CPU 71 lengthens V+ to increase the nozzle surface pressure Pn.

If it is determined that the nozzle surface pressure Pn satisfies that P1H<Pn (Yes in Act 8), the CPU 71 determines whether or not V− is equal to or greater than Vmax in Act 12. If it is determined that V− is equal to or greater than Vmax (Yes in Act 12), the CPU 71 decreases the nozzle surface pressure Pn by weakening the liquid feed capability of the first circulation pump 33 in Act 13. If it is determined that V− is smaller than Vmax (No in Act 12), the CPU 71 decreases the nozzle surface pressure Pn by increasing the liquid feed capacity of the second circulation pump 36 in Act 14.

In other words, if it is determined that the nozzle surface pressure Pn is larger than P1H, the CPU 71 weakens the liquid feed capability of the first circulation pump 33 or increases the liquid feed capability of the second circulation pump 36 to decrease the nozzle surface pressure Pn. If it is determined that the nozzle surface pressure Pn is smaller than P1H and V− reaches Vmax, the CPU 71 shortens V+ to decrease the nozzle surface pressure Pn. If it is determined that the nozzle surface pressure Pn is smaller than P1H and V− does not reach Vmax, the CPU 71 lengthens V− to decrease the nozzle surface pressure Pn.

In Act 7, if it is determined that the nozzle surface pressure Pn is within the appropriate range (Yes in Act 7), after the nozzle surface pressure Pn is increased in Act 10 or Act 11, or after the nozzle surface pressure Pn is decreased in Act 13 or Act 14, the CPU 71 proceeds to the processing in Act 15 to determine whether or not an instruction to terminate circulation is detected. If the instruction to terminate circulation is not detected (No in Act 5), the CPU 71 proceeds to the processing in Act 4. As a result, until the instruction to terminate circulation is detected, the CPU 71 repeats the processing in Act 4 to Act 14 to maintain the nozzle surface pressure Pn within the appropriate range.

In Act 15, if the instruction to terminate circulation is detected from a command from the host control device 13 (Yes in Act 15), the CPU 71 closes the on-off valve 37a of the intermediate tank 32 in Act 16 to seal the intermediate tank 32. Furthermore, the CPU 71 stops the first circulation pump 33 and the second circulation pump 36 in Act 17, and terminates the circulation processing.

The circulation device 30 having the above configuration converts the low voltage from the low-voltage power supply to a high voltage using one booster circuit 81, and switches the supply of the high voltage to the piezoelectric actuator 59 of the pump using the switching circuit 82. The switching circuit 82 is provided for each piezoelectric actuator 59 of the pump, and controls the time at which the high voltage is applied to the piezoelectric actuator 59. As a result, in the circulation device 30, the switching circuit 82 provided for each pump can adjust the potential difference generated between the two electrodes of the piezoelectric actuator 59 using the high voltage boosted by one booster circuit 81. According to such a configuration, the circulation device 30 does not need to have the booster circuit 81 for each pump. As a result, a space necessary for the circulation device 30 can be saved and a cost thereof can be reduced.

The piezoelectric actuator 59 has a characteristic that the potential of the electrode changes in accordance with the elapsed time from the start of energization. According to such a configuration, the circulation device 30 controls the length of the energization time of the piezoelectric actuator 59 from the start of the energization to the end of the energization using the switching circuit 82, and in this way, the driving voltage of the piezoelectric actuator 59 can be controlled.

Furthermore, the circulation device 30 measures the nozzle surface pressure Pn, and changes the energization time of the piezoelectric actuator 59 when the nozzle surface pressure Pn is beyond the appropriate range, and in this way, the nozzle surface pressure Pn can be maintained within the appropriate range. As a result, the circulation device 30 can perform an appropriate pressure control even when the performance of the pump changes over time, for example.

The switching circuit 82 is configured as a full bridge circuit for switching the direction of the driving voltage supplied to the piezoelectric actuator 59. The switching circuit 82 has four photocouplers. As a result, it is possible to connect the booster circuit 81 to the piezoelectric actuator 59 in a state in which the booster circuit 81 is insulated from the CPU 71.

In the liquid discharge device 10, the first circulation pump 33 and the second circulation pump 36 each are the piezoelectric pump. As a result, since there is no need to use a large drive source such as a motor or a solenoid for the pump, the structure of the pump can be simplified, the space can be saved, and material selection can be facilitated. For example, if the first circulation pump 33 and the second circulation pump 36 each are a tube pump, there is a possibility that the tube and the ink contact with each other. Therefore, it is necessary to select a material with which the tube or the ink is difficult to deteriorate. However, by using the piezoelectric pump, a portion contacting the liquid can be made of SUS (Single UNIX Specification) 316L, PPS (Polyphenylene sulfide), PPA (Polyphthalamide) or polyimide, which is excellent in chemical resistance.

In the above embodiment, when the nozzle surface pressure Pn exceeds the appropriate range even after the V+ is adjusted in the adjustable range, the nozzle surface pressure Pn can be further adjusted by adjusting V−. In this way, by adjusting the nozzle surface pressure Pn by operating a plurality of pumps in a combined manner, it is possible to improve the accuracy of the adjustment of the nozzle surface pressure Pn.

The circulation device 30 has the functions of the first circulation pump 33, the second circulation pump 36, the replenishing pump 53, the pressure sensors 39a and 39b, the liquid level sensor 54, and other functions necessary for controls of the ink supply, the ink circulation and the pressure adjustment. For this reason, as compared with a large-sized stationary type circulation device, the connection of flow path and the electrical connection between a main body of the inkjet recording apparatus 1 and the carriage 11a can be simplified. As a result, it is possible to reduce the size, weight, and cost of the inkjet recording apparatus 1.

According to the above configuration, since the circulation pump drive circuit 74 can be mounted on one control substrate, it is possible to reduce the size, weight, and cost of the inkjet recording apparatus 1. By mounting the circulation pump drive circuit 74 on one control substrate, a communication load of the communication interface 73 can be reduced. As a result, the required specification of the communication interface 73 can be suppressed.

In the above embodiment, the circulation pump drive circuit 74 drives the first circulation pump 33 and the second circulation pump 36, but it is not limited thereto. The circulation pump drive circuit 74 may further include the switching circuit 82 connected to a piezoelectric actuator of the replenishing pump 53 to drive the replenishing pump 53 using the high-voltage DC power supplied from the booster circuit 81. In this case, the module controller 38 may omit the replenishing pump drive circuit 75.

The circulation device 30 may further include a plurality of piezoelectric pumps 60 including the piezoelectric actuators 59. In this case, the circulation pump drive circuit 74 further includes the switching circuits 82 for driving the piezoelectric actuators 59 of the piezoelectric pumps 60, respectively. Specifically, the circulation pump drive circuit 74 includes the switching circuit 82 for each piezoelectric actuator 59 to operate most of the piezoelectric pumps 60 using the high-voltage DC power supplied from one booster circuit 81.

The liquid to be discharged is not limited to the ink for printing but may be liquid containing conductive particles for forming a wiring pattern of a printed wiring substrate or the like.

In addition to the above, for example, the liquid discharge head 20 may discharge ink droplets by deforming the diaphragm with static electricity, or discharge ink droplets from the nozzle using thermal energy from a heater or the like.

In the above embodiment, the liquid discharge device 10 is used in the inkjet recording apparatus 1, but it is not limited thereto. For example, the liquid discharge device 10 may be applicable to a 3D printer, an industrial manufacturing machine, medical applications or the like, and the size, weight and cost thereof can be reduced.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A liquid circulation device, comprising:
a plurality of piezoelectric pumps configured to circulate liquid between a replenishing tank and a liquid discharge head through an operation of a piezoelectric actuator thereof;
a DC power supply;
a switching circuit configured to switch an output of the DC power supply to provide a driving voltage to the piezoelectric actuator; and
a control circuit configured to control the driving voltage by controlling a switching timing of the switching circuit.

2. The liquid circulation device according to claim 1, wherein
the piezoelectric actuator comprises an electrode having a potential that increases in accordance with elapsed time from a start of energization, and
the control circuit controls the driving voltage by controlling a length of energization time of the piezoelectric actuator from the start of the energization to the end of the energization using the switching circuit.

3. The liquid circulation device according to claim 1, wherein
the switching circuit comprises a full bridge circuit for switching a direction of a driving voltage provided to the piezoelectric actuator.

4. The liquid circulation device according to claim 2, wherein
the switching circuit comprises a full bridge circuit for switching a direction of a driving voltage provided to the piezoelectric actuator.

5. The liquid circulation device according to claim 3, wherein
the full bridge circuit comprises four photocouplers.

6. The liquid circulation device according to claim 4, wherein
the full bridge circuit comprises four photocouplers.

7. A liquid discharge device, comprising:
a liquid discharge head configured to discharge liquid;
a plurality of piezoelectric pumps configured to circulate the liquid between a replenishing tank and the liquid discharge head through an operation of a piezoelectric actuator thereof;
a DC power supply;
a switching circuit configured to switch an output of the DC power supply to provide a driving voltage to the piezoelectric actuator; and
a control circuit configured to control the driving voltage by controlling a switching timing of the switching circuit.

8. The liquid discharge device according to claim 7, wherein
the piezoelectric actuator comprises an electrode having a potential that increases in accordance with elapsed time from a start of energization, and
the control circuit controls the driving voltage by controlling a length of energization time of the piezoelectric actuator from the start of the energization to the end of the energization using the switching circuit.

9. The liquid discharge device according to claim 7, wherein
the switching circuit comprises a full bridge circuit for switching a direction of a driving voltage provided to the piezoelectric actuator.

10. The liquid discharge device according to claim 8, wherein
the switching circuit comprises a full bridge circuit for switching a direction of a driving voltage provided to the piezoelectric actuator.

11. The liquid discharge device according to claim 9, wherein
the full bridge circuit comprises four photocouplers.

12. The liquid discharge device according to claim 10, wherein
the full bridge circuit comprises four photocouplers.

13. The liquid discharge device according to claim 7, wherein
the liquid is inkjet printing ink.

14. The liquid discharge device according to claim 7, wherein
the liquid discharge device is an inkjet head.

15. A liquid circulation method, comprising:
circulating liquid between a replenishing tank and a liquid discharge head through an operation of a plurality of piezoelectric pumps comprising a piezoelectric actuator;
supplying DC power;
configured to switching an output of the supplied DC power to provide a driving voltage to the piezoelectric actuator using a switching circuit; and
controlling a switching timing of the switching circuit to control the driving voltage.

16. The liquid circulation method according to claim 15, wherein
the piezoelectric actuator comprises an electrode having a potential that increases in accordance with elapsed time from a start of energization, and further comprising:
controlling a length of energization time of the piezoelectric actuator from the start of the energization to the end of the energization to control the driving voltage.

17. The liquid circulation method according to claim 15, further comprising:
switching a direction of a driving voltage provided to the piezoelectric actuator using a full bridge circuit.

18. The liquid circulation method according to claim 16, further comprising:
   switching a direction of a driving voltage provided to the piezoelectric actuator using a full bridge circuit.

19. The liquid circulation device according to claim 17, further comprising:
   switching a direction of a driving voltage provided to the piezoelectric actuator using four photocouplers.

20. The liquid circulation device according to claim 18, further comprising:
   switching a direction of a driving voltage provided to the piezoelectric actuator using four photocouplers.

\* \* \* \* \*